United States Patent [19]

Taniguchi et al.

[11] Patent Number: 4,666,291
[45] Date of Patent: May 19, 1987

[54] LIGHT-EXPOSURE APPARATUS

[75] Inventors: Motoya Taniguchi, Kamakura; Asahiro Kuni, Tokyo; Ryuichi Funatsu, Yokohama; Yukio Kembo, Yokohama; Akira Inagaki, Yokohama, all of Japan

[73] Assignee: Hitachi, Ltd., Tokyo, Japan

[21] Appl. No.: 852,729

[22] Filed: Apr. 16, 1986

[30] Foreign Application Priority Data

Apr. 17, 1985 [JP] Japan .................................. 60-80171
Jun. 21, 1985 [JP] Japan ................................ 60-134084
Oct. 3, 1985 [JP] Japan ................................ 60-219047

[51] Int. Cl.$^4$ .......................................... G03B 27/68
[52] U.S. Cl. ........................................ 355/52; 355/53; 355/76
[58] Field of Search ..................... 73/857; 269/24, 903; 355/53, 76, 125

[56] References Cited

U.S. PATENT DOCUMENTS

| 4,093,378 | 6/1978 | Horr et al. ............................ 355/76 |
| 4,239,381 | 12/1980 | Lacombat et al. .................... 355/53 |
| 4,298,273 | 11/1981 | Nishizuka et al. ................. 355/53 X |
| 4,315,692 | 2/1982 | Heinecke et al. ................. 355/76 X |
| 4,425,038 | 1/1984 | LaFiandra et al. ............... 355/52 X |
| 4,537,498 | 8/1985 | Banks et al. ....................... 355/53 X |

FOREIGN PATENT DOCUMENTS 59-106118 6/1984 Japan .

Primary Examiner—Richard A. Wintercorn
Attorney, Agent, or Firm—Antonelli, Terry & Wands

[57] ABSTRACT

A light-exposure apparatus which can keep uniform the gap between a mask and a wafer and reduce the density of arrangement of vertical movers adapted to deform the wafer to thereby reduce cost and weight of the apparatus. The apparatus has a thin plate deforming mechanism comprising a chuck platen for holding on its top surface the wafer, the bottom surface of the chuck platen being formed with imperforate slits patterned in the form of a grid composed of a plurality of triangular meshes so that the chuck platen may be deformed along bending lines near the triangular meshes, and a plurality of vertical movers for vertically deforming the individual triangular meshes so as to flatten or deform into a desired shape the wafer.

7 Claims, 14 Drawing Figures

LIGHT-EXPOSURE APPARATUS

BACKGROUND OF THE INVENTION

This invention relates to a light-exposure apparatus with a thin plate deforming mechanism suitable either for flattening a thin plate such as a silicon wafer, bubble wafer, ceramics substrate or printing board when the thin plate is desired to be exposed to light or for concavely bending the thin plate when an optical image is formed on that thin plate.

Conventionally, to manufacture a desired circuit in LSIs, for example, a resist film is coated on a silicon wafer, a desired pattern formed on a mask is transferred to the resist film, and such treatments as etching and ion implantation are repeated.

In the LSIs, it is required that the width of lines constituting a fine circuit pattern be 1 m or less in order to improve the degree of integration. To meet this requirement, the use of soft X-rays, for example, has been proposed for transfer of the mask pattern.

Of several proposals, an X-ray exposure apparatus using soft X-rays is disclosed in, for example, Japanese Patent Unexamined Publication No. 57-169242. When using soft X-rays for exposure, however, the soft X-rays generated from a generator greatly attenuate before reaching the resist film formed on the wafer, as well known in the art.

To cope with this problem, many improvements have been made by increasing the dose of soft X-rays generated from the X-ray generator, or making the mask from a material which is easy to transmit soft X-rays and minimizing the thickness of the mask.

Mechanical strength of the mask will be decreased in proportion to a decrease in its thickness and hence a thin mask of a large area is difficult to produce. Thus, in a proposed step and repeat transfer method, a thin mask is prepared for formation of one to several LSIs at the most, and a wafer is moved stepwise pattern by pattern so that patterns for individual LSIs may be sequentially transferred onto the wafer. The thin mask is however difficult to flatten.

On the other hand, the soft X-rays from the generator are radially divergent and propagate straight-forwardly. The source of soft X-ray generator has an area corresponding to the diameter or size of an electron beam which irradiates an anode electrode. Accordingly, the soft X-rays from the generator pass through the mask and reach different positions on the resist film formed on the wafer which cover the area of source of the generator, resulting in a blur or such a shift that the soft X-rays irradiate a position which is in slight misregistration with the mask pattern.

Incidentally, the mask is adversely affected by many factors such as errors in its manufacture, distortion due to temperature rise upon exposure, distortion due to its aging especially when the mask is used repetitiously, distortion due to gravitative weight of the mask when the mask is deformed by chucking during mounting it to the light-exposure apparatus, and distortion due to the difference between air pressures exerted on the top and bottom surfaces of the mask. The wafer is also affected adversely by many factors such as distortion caused in the course of its manufacture, distortion caused by chucking when mounting it to the light-exposure apparatus, and distortion caused during such processes as etching and ion implantation.

Accordingly, in order to transfer a circuit pattern of lines having a width of 1 μm or less onto the wafer, a surface area of a portion of wafer to be exposed to light must be so deformed as to be placed in the best condition for receiving a pattern image projected from the mask.

An apparatus contrived to meet this requirement has been proposed in, for example, "Flatness Controlled Wafer Clamping Pedestal", *IBM Technical Disclosure Bulletin*, Vol. 15, No. 10, 1973. In this proposal, a pedestal is formed with holes for vacuum absorption and piezoelectric devices are disposed in association with the pedestal. When a wafer is placed on the pedestal and absorbed thereby by vacuum (vacuum absorbed), heights of the wafer top surface are detected at different points by means of a sensor and desired voltages based on results of detection are applied to the piezoelectric devices to push up the bottom surface of the wafer so that the top surface of the wafer may be flattened.

With this apparatus, however, a gap takes place between the wafer pushed up by the piezoelectric devices and the pedestal, with the result that the wafer clamping force by vacuum is weakened and the wafer tends to slip under the influence of an air current flowing through the gap. Further, unless the piezoelectric devices are arranged uniformly over the entire area of the wafer, the wafer can not be flattened or deformed into a desired shape. Thus, when the piezoelectric devices are arranged at 10 mm intervals over the entire area of a wafer of, for example, 4-inch diameter, the number of the piezoelectric devices amounts up to 105; for a wafer of 5-inch diameter, there needs 149 piezoelectric devices. The same number of drivers must be provided for the piezoelectric devices. Normally, the driver must apply voltages of 0 (zero) to 650 V to the piezoelectric device and such a driver is technically difficult to miniaturize. Therefore, equipping the light-exposure apparatus with a great number of drivers faces technical difficulties and besides, unnecessarily increases size and cost of the apparatus.

Another conventional apparatus is disclosed in Japanese Patent Unexamined Publication No. 59-106118 wherein piezoelectric devices adapted to deform a wafer are brought into contact with a wafer absorptive thin plate in evacuated atmosphere and expanded or contracted to partially deform the wafer absorbed to the wafer absorptive thin plate. This apparatus however calls for high density of arrangement of the piezo-electric devices for the sake of flattening the entire area of the wafer, resulting in complexity of its construction and high cost.

SUMMARY OF THE INVENTION

The present invention contemplates elimination of the aforementioned conventional drawbacks and has for its object to provide a light-exposure apparatus capable of keeping uniform the gap between a mask and a wafer and reducing the density of arrangement of vertical movers adapted to deform the wafer to thereby reduce cost and weight of the apparatus.

To accomplish the above object, a light-exposure apparatus according to the invention is featured by the provision of a thin plate deforming mechanism comprising a chuck platen for holding on its top surface a thin plate such as a wafer, the bottom surface of the chuck platen being formed with imperforate slits patterned in the form of a grid composed of a plurality of triangular meshes so that the chuck platen may be deformed plastically along bending lines near the triangular meshes, and a plurality of vertical movers for vertically deforming the individual triangular meshes so as to flatten or deform into a desired shape the thin plate.

DESCRIPTION OF THE PREFERRED EMBODIMENTS

The invention will now be described by way of example with reference to the accompanying drawings.

Figure 1:
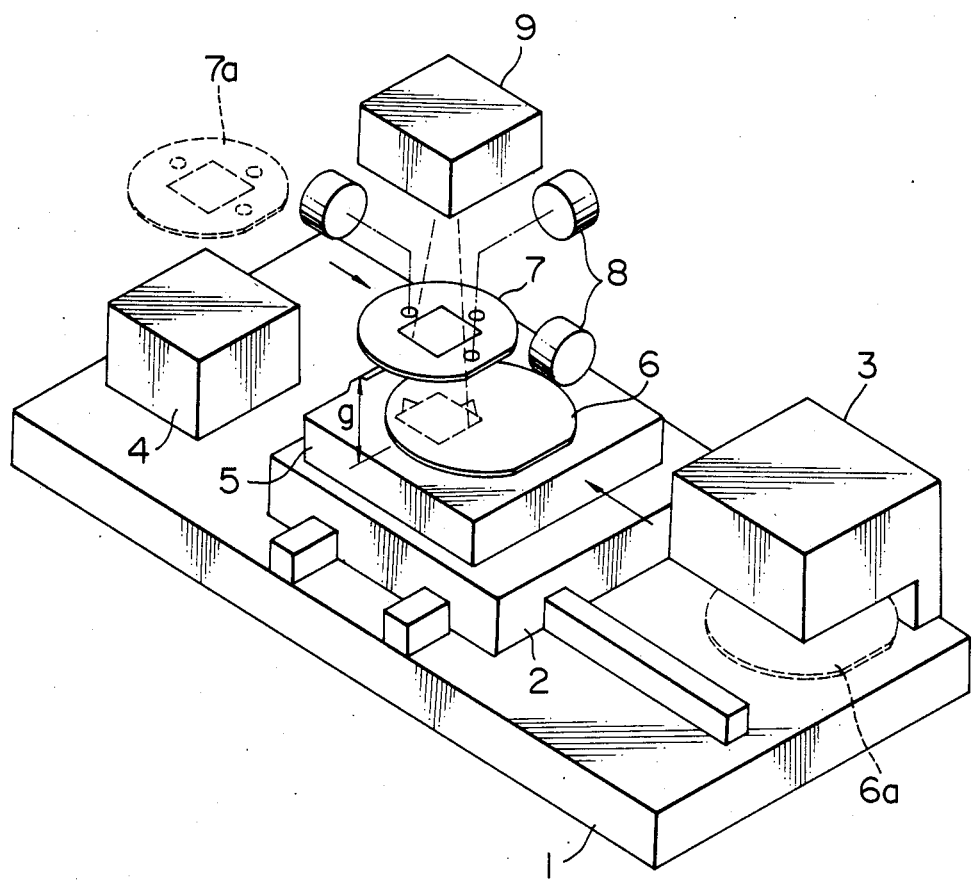
FIG. 1 is a perspective view showing a light-exposure apparatus according to an embodiment of the invention.

FIG. 1 illustrates a light-exposure apparatus according to a preferred embodiment of the invention. As shown, a base 1 carries at its center an XY table 2, and a wafer flatness detector 3 and a mask flatness detector 4 which are disposed on the opposite sides of the XY table. The XY table 2 carries a thin plate deforming mechanism 5 on which a wafer 6 whose flatness has been detected is fixedly placed. Above the wafer 6, a mask 7 whose flatness has been detected is disposed to oppose the wafer 6 through a small gap g. Above the mask 7, there are disposed alignment detectors 8. The XY table 2 is responsive to output signals of the alignment detectors 8 so as to be moved for establishing registration between the mask 7 and the wafer 6. Upon establishment of the registration between mask 7 and wafer 6, the thin plate deforming mechanism 5 is operated to deform the wafer 6 into a desired shape. Above the mask 7, a soft X-ray generator 9 is also disposed. Soft X-rays produced from the soft X-ray generator 9 are irradiated on the wafer 6 through the mask 7. If a resist film reactive with the soft X-rays is coated on the wafer 6, a pattern formed on the mask 7 can be transferred onto the resist film by irradiating the soft X-rays on the pattern.

The thin plate deforming mechanism 5 used in the light-exposure apparatus will be described in greater detail by referring to FIGS. 2, 3, 4, 5a and 5b.

Figure 2:
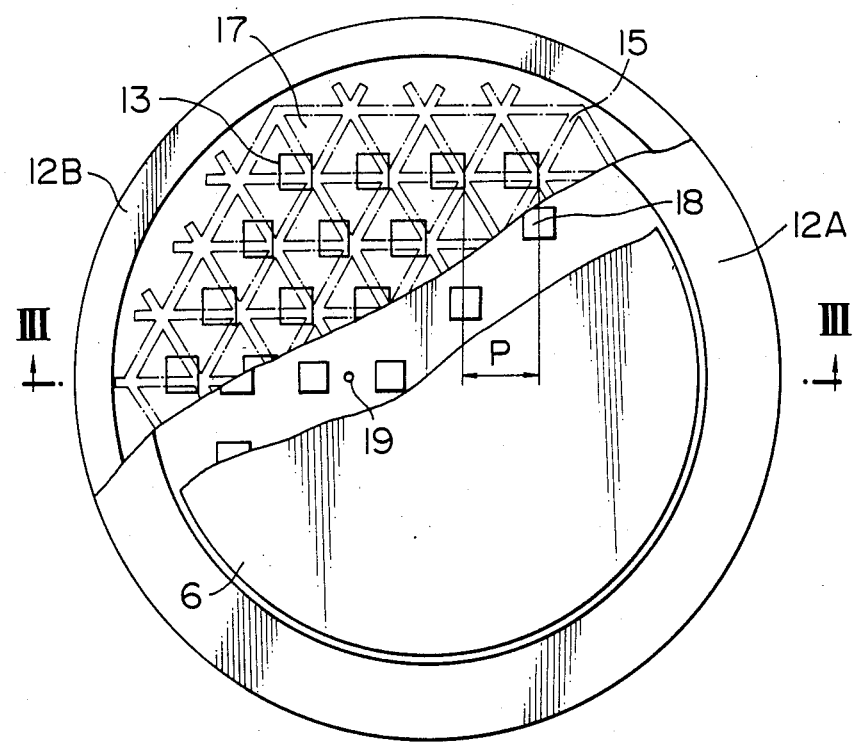
FIG. 2 is a plan view, partly exploded, showing an embodiment of a thin plate deforming mechanism used in the apparatus.
Figure 3:
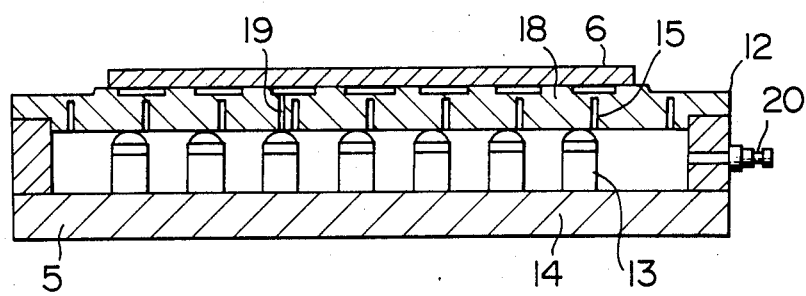
FIG. 3 is a longitudinal sectional view taken on line A—A in FIG. 2.

Making reference to FIGS. 2 and 3, first of all, the thin plate deforming mechanism 5 serving as a thin plate flattening chuck comprises a chuck platen 12 having a top surface 12A which is operated by vacuum to absorb the wafer 6, a plurality of vertical movers 13 joining or being in contact with a bottom surface 12B of the chuck platen 12, and a housing 14 cooperative with the chuck platen 12 to form a vacuum enclosure which houses the vertical movers 13. The bottom surface 12B of the chuck platen 12 is formed with a number of slits (imperforated) 15 as shown by chained lines in FIG. 2 which are patterned in the form of a grid composed of a number of triangular meshes 17, for example. The individual vertical movers 13 are arranged near respective intersections of the slits 15 so as to move respective triangular meshes 17 independently in the vertical direction. The housing 14 is evacuated by a vacuum source 20 in communication therewith so that the chuck platen 12 may be brought into close contact with the vertical movers 13.

The planar chuck platen 12 is made of a material such as carbon steel, aluminum, silicon, stainless or phosphor bronze and its top surface is formed with a number of recesses 18. A number of vacuum suction ports 19 traverse the thickness of the chuck platen 12 to communicate with the recesses, thereby allowing the chuck platen 12 to absorb the wafer 6 by vacuum.

Figure 4:
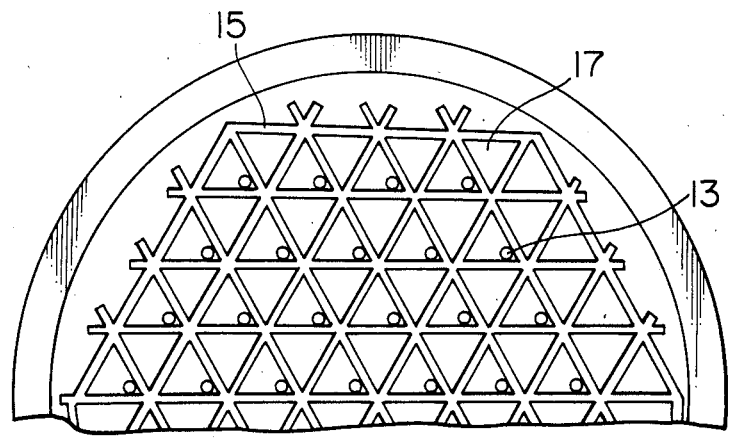
FIG. 4 is a fragmentary bottom view showing part of the bottom surface of a chuck platen.
Figure 5A:
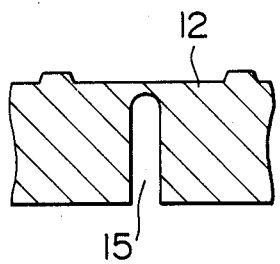
FIG. 5a and 5b are enlarged sectional side views illustrating examples of an imperforate slit.
Figure 5B:
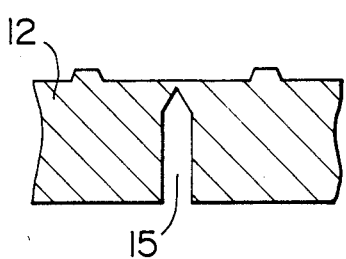

The grid of triangular meshes 17 as viewed from the bottom of the chuck platen 12 is illustrated in FIG. 4. Each of the imperforate slits 15 terminates in a U-shaped top end as shown in FIG. 5a or a V-shaped top end as shown in FIG. 5b to ensure that each of the triangular meshes 17 can elastically be deformed with ease along bending lines near the slits 15.

The vertical movers 13 are required to have a sufficient stroke to flatten the wafer 6. Considering warp and undulation (unevenness in thickness) of the wafer being less than 10 to 20 $\mu$m, it is satisfactory for the vertical mover 13 to have a stroke of 20 to 50 $\mu$m. Most preferably, a piezoelectric device which expands or contracts under the application of voltage is used as the vertical mover 13.

Especially, to obtain a large stroke, a lamination type piezoelectric device is used wherein a plurality of planar piezoelectric elements are laminated and a voltage is applied in parallel to all the elements. For example, with this type of device having 100 laminar elements, a stroke of 20 $\mu$m can be obtained under the application of a voltage of 200 V.

With a view to reducing size and cost, a lamination type piezoelectric device may preferably be employed which is manufactured, on the thick film ceramics sintering technique basis, by printing electrodes on alternate laminar layers of green sheet-like piezoelectric material, stacking the laminar layers, and sintering the resulting assembly.

Another embodiment of the thin film deforming mechanism will now be described with reference to FIGS. 6 to 11.

Figure 6:
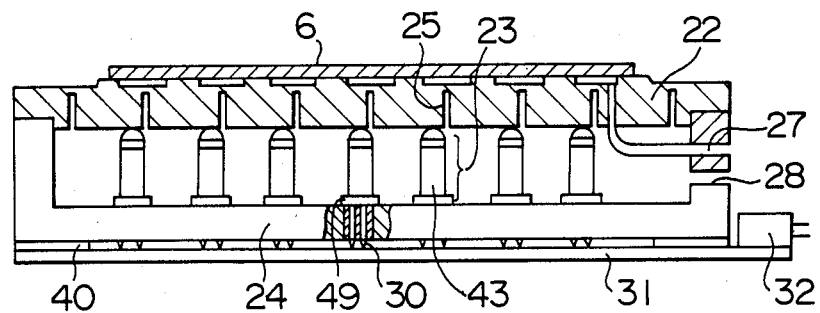
FIG. 6 is a sectional view, sectioned diametrically, showing another embodiment of the thin plate deforming mechanism.

As shown in FIG. 6, a thin film deforming mechanism according to this embodiment comprises a chuck platen 22 which fixedly absorbs a wafer 6 when evacuated through a conduit 27, a number of vertical movers 23 disposed beneath the chuck platen 22 to vertically deform the chuck platen, and a housing 24. Like the previously-described mechanism, the bottom surface of the chuck platen 22 is formed with a number of imperforate slits 25 patterned in the form of a grid of triangular meshes so that the chuck platen may be plastically deformed along bending lines near the slits.

When the interior of the housing 24 is evacuated through a vacuum port 28, the chuck platen 22 is pulled downwards until it is held in position by being supported on tips of the vertical movers 23 disposed beneath the chuck platen. As in the previous embodiment, the chuck platen 22 rests on almost pointed tips of the vertical movers 23 near apices of the triangular meshes.

The vertical mover 23 is required to have a stroke of 20 to 30 $\mu$m with resolution of about 0.1 $\mu$m and hence materialized with a piezoelectric device.

Figure 8:
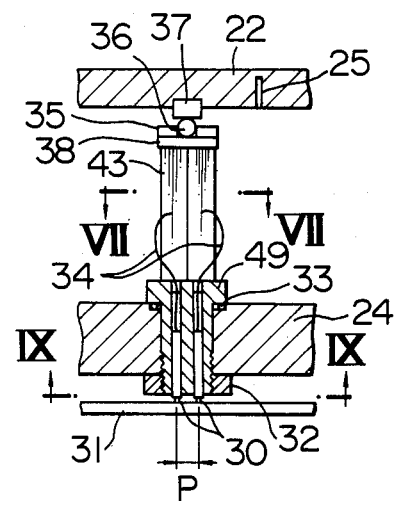
FIG. 8 is a sectional front view showing the construction of a vertical mover.
Figure 9:
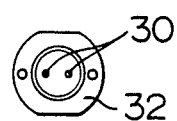
FIG. 9 is a diagram as viewed from line B-B' in FIG. 8.
Figure 10:
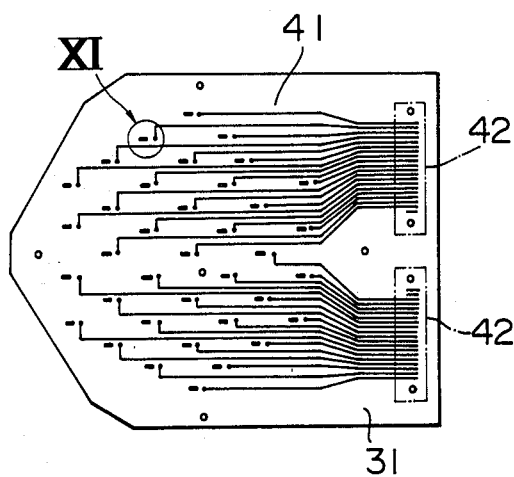
FIG. 10 illustrates a wiring pattern formed on a printing board.
Figure 11:
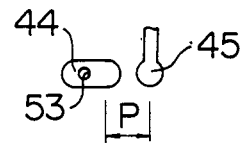
FIG. 11 exaggeratedly illustrates an electrode portion (C)

Details of the vertical mover 23 are illustrated in FIGS. 7 to 11. A piezoelectric device 43 is fixedly bonded to a base 49 which is mounted to the housing 24 through an O-ring 33 by tightening a nut 32. The base 49 is made of an insulating material such as ceramics and has through-holes in which fixedly bonded are spring contact probes 30 respectively connected to two lead wires 34 extending from the piezoelectric device 43. Each piezoelectric device 43 is supplied with a voltage through a printed circuit board 31 and the spring contact probes 30. The printed circuit board 31 has such a wiring pattern 41 as shown in FIG. 10 and is fixed to the housing 24 through the medium of a spacer ring 40 as best seen from FIG. 6. The printed circuit board 31 is fed from an external power source through connectors 42 located at an end portion of the printed circuit board.

Figure 7:
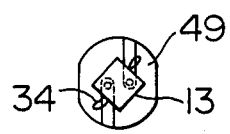
FIG. 7 is a diagram as viewed from line A-A' in FIG. 8.

The printed circuit board 31 used is exemplified in FIG. 10, having the wiring pattern 41 printed at locations corresponding to the piezoelectric devices 43. The spring contact probes 30 make contact with the printed circuit board 31 at a wiring pattern portion C encircled in FIG. 10 and exaggerated in FIG. 11. The portion C includes a ground electrode 44 and a positive voltage supply electrode 45, the former being connected via a through-hole 53 to a common ground electrode (not shown) formed on the back of the printed circuit board 31. The two electrodes 44 and 45 are mutually spaced apart by a distance $P_2$ corresponding to spacing between the two probes 30. For clarity of illustration, the piezoelectric device of FIG. 8 is viewed from line A-A' as shown in FIG. 7 and from line B-B' as shown in FIG. 9.

Jointing of the piezoelectric device 43 to the chuck platen 22 is established through a plate 37 bonded to the platen 22, plates 35 and 38 bonded to the device 43 and a ball 36 (such as a ruby ball) received in a central opening of the plate 35 and is held by vacuum.

Thus, the plurality of vertical movers (piezoelectric devices) adapted to flatten the wafer can be supplied with voltages collectively through the printed circuit board formed with the requisite wiring pattern, thereby making it possible to eliminate separate wirings to the individual devices, improve reliability, reduce cost, and decrease the thickness and weight of the wafer/chuck platen assembly.

The thin film deforming mechanism of the construction described previously is operated to flatten the wafer as will be described below with reference to FIGS. 12 and 13.

Figure 12:
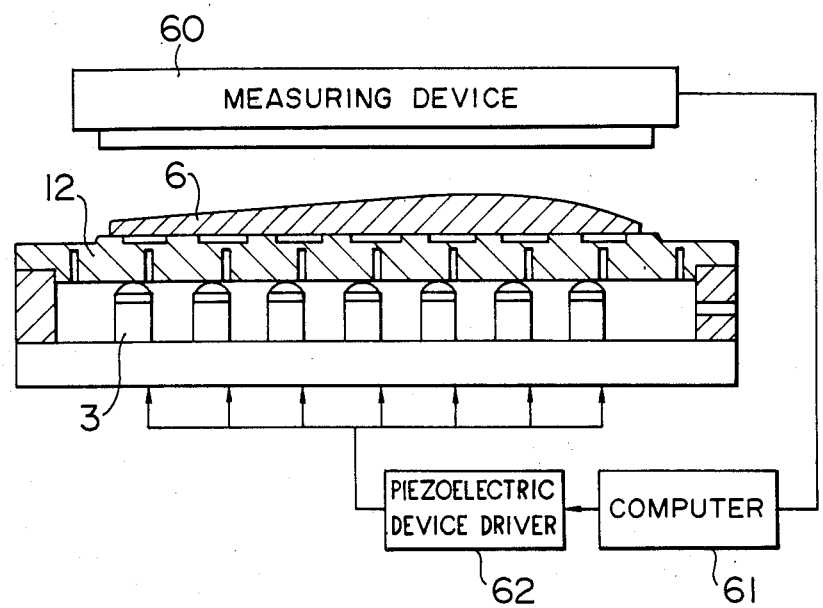
FIG. 12 is a diagrammatic representation useful in explaining the operation of the thin plate deforming mechanism when a wafer is vacuum absorbed to the chuck platen.
Figure 13:
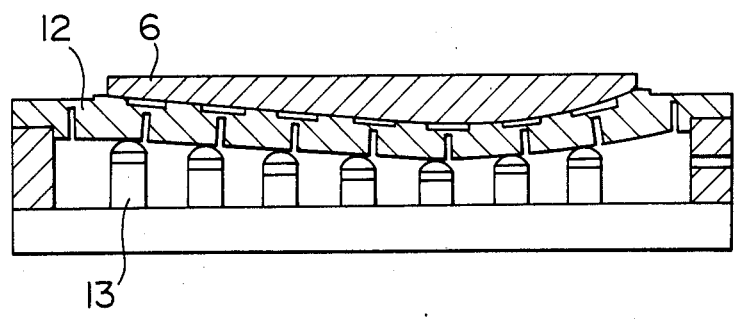
FIG. 13 is a similar diagram when the wafer is flattened.

When, as shown in FIG. 12, a wafer 6 having a warp or an undulation (unevenness in thickness) is held in place on the chuck platen 12, the chuck platen 12 vacuum absorbs the wafer 6 to even the warp of the wafer 6 with the undulation not yet corrected. As a result, the wafer 6 rests on the chuck platen 12 to exhibit a surface flatness as shown in FIG. 12 which in turn is measured by a measuring device 60. Used as the measuring device 60 is a flatness meter based on known technique of laser interference fringe method or electrostatic capacitance type sensors.

A computer 61 computes amounts of expansion or contraction of the vertical movers 13 (piezoelectric devices) on the basis of measurement results of the wafer flatness obtained from the measuring device 60, and causes a piezoelectric device driver 62 connected to the computer 61 to apply corresponding voltages to the vertical movers 13. The thus operated vertical movers 13 cooperate together to flatten the surface of the wafer 6, as shown in FIG. 13.

In the above process, the wafer 6 can be flattened within $\pm 0.5$ $\mu$m by deforming the chuck platen 12 by means of the piezoelectric devices 13 which undergo fine controlling with resolution of less than 0.1 $\mu$m.

Since, in the foregoing embodiments, the chuck platen 12 is deformed along bending lines near the slits 15 patterned in the form of the grid of triangular meshes 17, the entire surface of the wafer 6 can be flattened uniformly and the density of arrangement of the vertical movers 13 can be lowered. For example, with a chuck platen of 5-inch diameter, the pitch P of the grid (FIG. 2) is 25 mm and the number of vertical movers 13 used is 37.

As described above, according to the present invention, the wafer (thin plate) can be flattened within $\pm 0.5$ $\mu$m to eliminate (correct) warp and undulation (irregular thickness) of the wafer. This permits the formation of highly precise patterns in the light-exposure apparatus adapted to form fine patterns of semiconductors.

In addition, the gap between the mask and the wafer can be kept uniform in the X-ray exposure apparatus and therefore pattern exposure with high resolution can be assured.

Moreover, the deformation of the wafer can approximate the bending lines, with the result that the density of arrangement of vertical movers can be lowered to thereby reduce the size, weight and production cost of the flattening chuck.

We claim:
1. A light-exposure apparatus having a thin plate deforming mechanism, said mechanism comprising:
   a chuck platen for vacuum absorbing to its top surface a thin plate, said chuck platen having its bottom surface formed with imperforate slits patterned in the form of a grid composed of a plurality of meshes so that the chuck platen may be deformed plastically along bending lines near said meshes; and
   a plurality of vertical movers for vertically deforming the individual meshes so as to deform said thin plate into a desired shape, whereby the gap between another thin plate formed with a pattern and said thin plate to which the pattern is transferred is kept uniform.

2. A light-exposure apparatus according to claim 1, wherein said slit terminates in a U-shaped or V-shaped top end.

3. A light-exposure apparatus according to claim 1, wherein said vertical mover has electrodes which make contact with a printed circuit board so as to supply an electrical signal to said vertical mover.

4. A light-exposure apparatus according to claim 1, wherein said mesh is triangular.

5. A thin plate deforming mechanism comprising:

a chuck platen for vacuum absorbing to its top surface a thin plate, said chuck platen having its bottom surface formed with imperforate slits patterned in the form of a grid composed of a plurality of meshes so that the chuck platen may be deformed along bending lines near said meshes; and
a plurality of vertical movers for vertically deforming the individual meshes so as to deform said thin plate into a desired shape.

6. A thin plate deforming mechanism according to claim 5, wherein said slit terminates in a U-shaped or V-shaped top end.

7. A thin plate deforming mechanism according to claim 5, wherein said mesh is triangular.

* * * * *